(12) United States Patent
Ruan et al.

(10) Patent No.: US 7,732,324 B2
(45) Date of Patent: Jun. 8, 2010

(54) SEMICONDUCTOR DEVICE HAVING IMPROVED ADHESION AND REDUCED BLISTERING BETWEEN ETCH STOP LAYER AND DIELECTRIC LAYER

(75) Inventors: Ju-Ai Ruan, Plano, TX (US); Sameer K. Ajmera, Richardson, TX (US); Changming Jin, Plano, TX (US); Anand J. Reddy, Palo Alto, CA (US); Tae S. Kim, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 126 days.

(21) Appl. No.: 11/961,464

(22) Filed: Dec. 20, 2007

(65) Prior Publication Data

US 2009/0160059 A1 Jun. 25, 2009

(51) Int. Cl.
*H01L 21/469* (2006.01)
(52) U.S. Cl. ............... 438/624; 438/763; 438/786; 438/791; 438/792; 257/E21.493
(58) Field of Classification Search ............... 438/970; 257/E21.493
See application file for complete search history.

(56) References Cited

U.S. PATENT DOCUMENTS

| 7,501,355 | B2 * | 3/2009 | Bhatia et al. | 438/791 |
|---|---|---|---|---|
| 7,563,704 | B2 * | 7/2009 | Yang et al. | 438/622 |
| 2006/0046479 | A1 * | 3/2006 | Rajagopalan et al. | 438/683 |
| 2006/0286817 | A1 * | 12/2006 | Kato et al. | 438/791 |
| 2007/0111546 | A1 * | 5/2007 | Iyer et al. | 438/791 |
| 2008/0254641 | A1 * | 10/2008 | Kobayashi et al. | 438/763 |

\* cited by examiner

*Primary Examiner*—Stephen W Smoot
(74) *Attorney, Agent, or Firm*—Warren L. Franz; Wade J. Brady, III; Frederick J. Telecky, Jr.

(57) ABSTRACT

One aspect of the invention provides a method of forming a semiconductor device (100). One aspect includes forming transistors (120, 125) on a semiconductor substrate (105), forming a first interlevel dielectric layer (165) over the transistors (120, 125), and forming metal interconnects (170, 175) within the first interlevel dielectric layer (165). A carbon-containing gas is used to form a silicon carbon nitride (SiCN) layer (180) over the metal interconnects (170, 175) and the first interlevel dielectric layer (165) within a deposition tool. An adhesion layer (185) is formed on the SiCN layer (180), within the deposition tool, by discontinuing a flow of the carbon-containing gas within the deposition chamber. A second interlevel dielectric layer (190) is formed over the adhesion layer (185).

25 Claims, 5 Drawing Sheets

SEMICONDUCTOR DEVICE HAVING IMPROVED ADHESION AND REDUCED BLISTERING BETWEEN ETCH STOP LAYER AND DIELECTRIC LAYER

TECHNICAL FIELD

The disclosure is directed to a semiconductor device having improved adhesion and reduced blistering between an etch stop layer and a dielectric layer, and to a method of manufacture therefor.

BACKGROUND

To provide semiconductor devices that meet increased device performance in the face of steadily decreasing device sizes has posed significant challenges to the semiconductor manufacturing industry. Semiconductor manufacturers have sought various ways to overcome these challenges.

One such effort has centered on decreasing parasitic capacitance that arises within the semiconductor devices themselves. Manufacturers have sought to decrease parasitic capacitance by replacing silicon nitride (SiN) layers that are used as etch stop layers for damascene and dual damascene interconnect structures with materials having lower dielectric constants, such as silicon carbide (SiCN). The use of SiCN in place of SiN beneficially reduces the amount of parasitic capacitance within the semiconductor devices.

However, with the use of SiCN, other problems have arisen. One such problem is that SiCN does not adhere well to the overlying dielectric material, which typically comprises materials, such as organosilicate glass (OSG) or fluorosilicate glass (FSG). As a result, blistering can occur, which reduces device reliability and yield.

SUMMARY

In one embodiment, a method of manufacturing a semiconductor device is provided. This embodiment comprises forming transistors on a semiconductor substrate, forming a first interlevel dielectric layer over the transistors, and forming metal interconnects within the first interlevel dielectric layer. A carbon-containing gas is used to form a silicon carbon nitride (SiCN) layer over the metal interconnects and the first interlevel dielectric layer within a deposition chamber. A silicon nitride (SiN) layer is formed in situ on the SiCN layer, within the deposition chamber, by discontinuing a flow of the carbon-containing gas and flowing silane and nitrogen, and a second interlevel dielectric layer is formed over the SiN layer in a dielectric deposition chamber.

An additional embodiment provides another method of manufacturing a semiconductor device. In this embodiment, the method comprises forming transistors on a semiconductor substrate, forming a first interlevel dielectric layer over the transistors, and forming metal interconnects within the first interlevel dielectric layer. A carbon-containing gas is used to form a silicon carbon nitride (SiCN) layer over the metal interconnects and the first interlevel dielectric layer within a deposition tool. An adhesion layer is formed on the SiCN layer, within the deposition tool, by discontinuing a flow of the carbon-containing gas within the deposition chamber. A second interlevel dielectric layer is formed over the adhesion layer.

In another embodiment, the method comprises forming transistors on a semiconductor substrate, forming a first interlevel dielectric layer over the transistors, forming metal interconnects within the first interlevel dielectric layer, and forming a silicon carbon nitride (SiCN) layer over the metal interconnect and the first interlevel dielectric layer within a deposition chamber. The semiconductor device is placed in a dielectric deposition chamber subsequent to forming the SiCN layer and a silicon nitride (SiN) layer is formed on the SiCN within the dielectric deposition chamber using an oxygen plasma to convert a portion of the SiCN layer to SiN. A second interlevel dielectric layer is formed over the SiN layer in the dielectric deposition chamber.

In yet another embodiment, a semiconductor device is provided. In this embodiment, the semiconductor device comprises transistors located on a semiconductor substrate, interlevel dielectric layers located over the transistors, metal interconnect levels located within the interlevel dielectric layers that interconnect the transistors, a silicon carbide (SiCN) layer located over at least one of the metal interconnect levels and at least one of the interlevel dielectric layers, and an in situ formed silicon nitride (SiN) layer located on the at least one SiCN layer, wherein the SiN layer has a thickness of about 5 nm or less.

BRIEF DESCRIPTION OF DRAWINGS

The disclosure is described with reference to example embodiments and to accompanying drawings, wherein.

DETAILED DESCRIPTION

Figure 1:
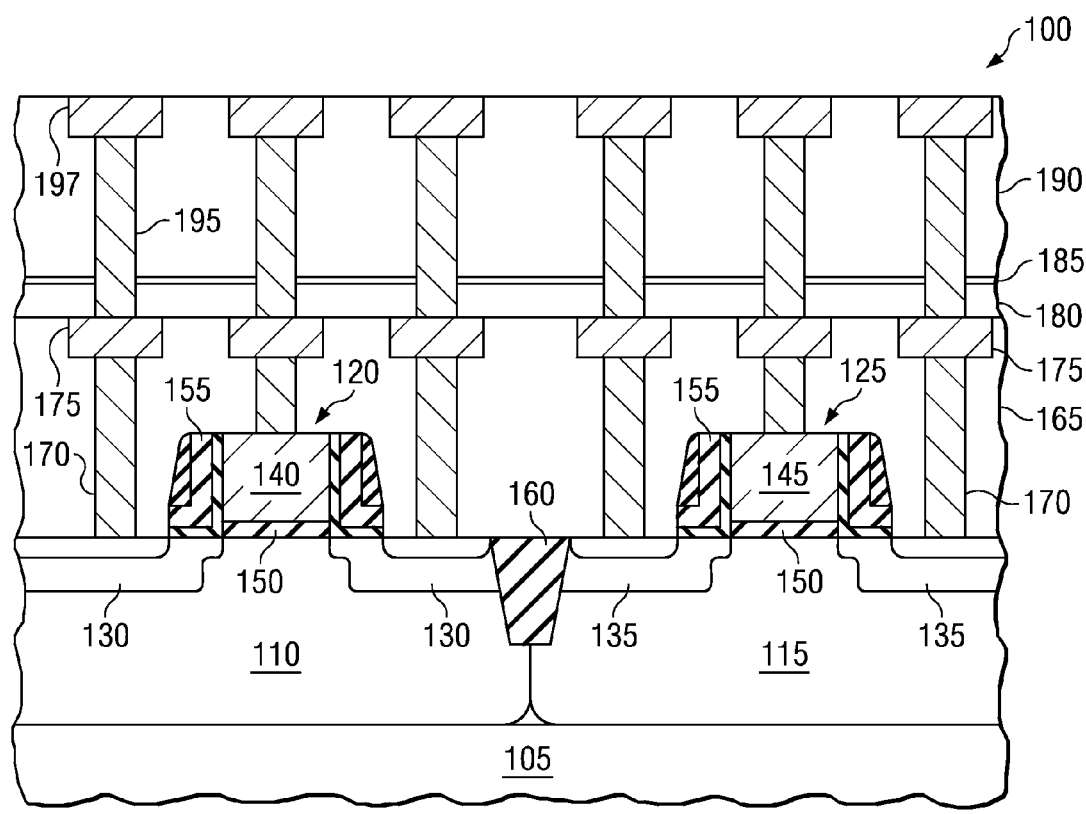
FIG. 1 illustrates a semiconductor device that can be made using the principles of the invention.

FIG. 1 illustrates one embodiment of a semiconductor device 100 of the invention. In this embodiment, the device 100 includes a semiconductor substrate 105. The substrate 105 may be any semiconductor layer located on a semiconductor wafer, such as an epitaxial layer, or it may be a doped region of the wafer. The substrate 105 may comprise conventional materials, such as doped silicon, gallium arsenide, silicon-on-insulator, silicon germanium, etc. Wells 110, 115 are formed in the substrate 105 and may be conventionally formed, and they may be doped the same or in a complementary fashion.

The device 100 comprises transistors 120, 125 located on the semiconductor substrate 105, which includes portions of the transistors 120, 125 that are located over and within the substrate 105, as illustrated in the embodiment of FIG. 1. The transistors 120, 125 may be of conventional design and may be fabricated using conventional materials and fabrication processes. In one embodiment, the transistors include source/drains 130, 135 located in each of the wells 110, 115, and gate electrodes 140, 145, gate dielectric layers 150 and sidewall spacers 155. Isolation structures 160 electrically isolate source/drains 130, 135 from each other.

A first interlevel dielectric layer 165 is located over the transistors 120, 125. An interlevel dielectric layer is one in which either vias or contact plugs 170 are located and is one where metal runners or lines 175 are located on or within the layer 165. The vias and contact plugs 170, along with the metal runners 175, form interconnects within the device 100. Conventional damascene or dual damascene processes may be used to form the metal runners or lines 175. The dielectric layer 165 may also be referred to as a metallization level.

Typically, the semiconductor device 100 may include as many as eight or more such levels. Conventional processes and materials may be used to fabricate the dielectric layer 165. In one embodiment, dielectric layer 165 may comprise a high-k material. For the interlevel dielectric layers, a material is considered to have a high-k if it has a value of greater than about 3.8. In such embodiments, a high-k material, such as plasma enhanced tetra-orthosilicate (PETOS), may be used to form dielectric layer 165. In another embodiment, a low-k material, which has a dielectric constant of about 3.8 or less, may be used to form dielectric layer 165. For example, OSG or FSG may be used. Located over layer 165 is a silicon carbon nitride (SiCN) layer 180, which may function as an etch stop layer and which may have a low-k.

Because of its low-k properties, SiCN reduces parasitic capacitance as compared to other conventional etch stops, such as silicon nitride (SiN), which have higher dielectric constants. With respect to these materials, a high-k material may have a dielectric constant that ranges from about 6.5 to 7.5, or higher, and a low-k material is one that has a dielectric constant that ranges from about 5.5 to 4.5, or lower. However, it has been found that SiCN does not bond as well to low-k materials, which can result in blistering. To avoid this problem, the embodiments discussed herein, provide for an adhesion layer 185 located on the SiCN layer 180 that bonds well to an overlying interlevel dielectric layer. In certain embodiments, the adhesion layer 185 is much thinner than the SiCN layer 180. For example, SiCN layer 180 may have a thickness of as much as 100 nm, while the thickness of the adhesion layer 185 may be 5 nm or less. In those instances where the material used to form the adhesion 185 has a higher dielectric constant than the SiCN layer, a thin layer is beneficial because the overall dielectric constant can be kept lower, thereby reducing parasitic capacitance.

As explained in more detail below, the adhesion layer 185 is formed in situ, that is, it is formed in the same deposition tool in which a previous or subsequent material is deposited without breaking vacuum. The deposition tool may be a conventional cluster deposition tool that includes multiple chambers where wafers can be transferred from one chamber to another within the tool without breaking the tool's vacuum. For example, in one embodiment, the adhesion layer 185 is subsequently formed in the same deposition chamber in which the SiCN layer is deposited, and in another embodiment, it is formed in the same deposition chamber in which an interlevel dielectric layer is subsequently formed. In yet other embodiments, the adhesion layer 185 may be formed in situ where the previous or subsequent material was deposited in one chamber of the deposition tool, and the semiconductor device 100 is then transferred to another chamber of that same tool, without breaking the deposition tool's vacuum.

After the formation of the adhesion layer 185, another interlevel dielectric layer 190 is formed over the adhesion layer 185. This is followed by the formation of additional interconnects 195 and 197, as was the case with interlevel dielectric layer 165.

Figure 2A:
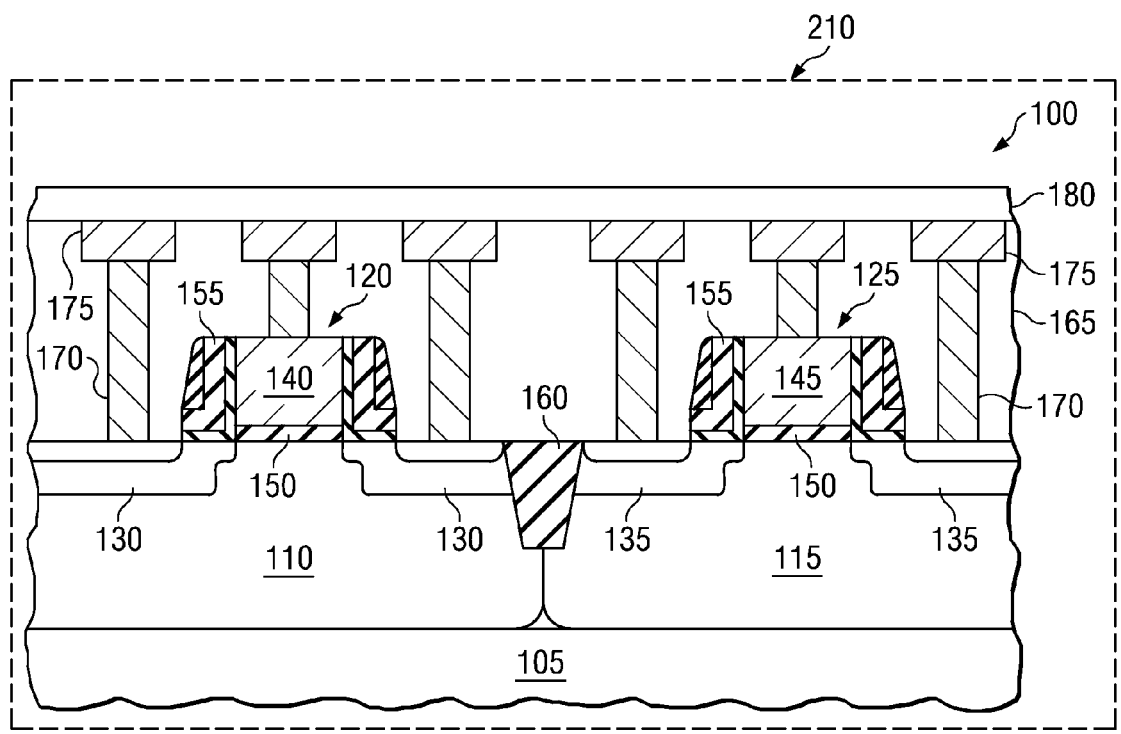
FIGS. 2A-2D illustrate one embodiment of a method that can be used to fabricate the device of FIG. 1.

FIG. 2A illustrates the semiconductor device 100 at an earlier stage of manufacture than that shown in FIG. 1. In this embodiment, the previously discussed components, which are similarly designated, have been formed. As seen, the SiCN layer 180 may be formed over the first interlevel dielectric layer 165. The SiCN layer 180 provides the benefit of having a low-k (e.g., lower than that of SiN) that, along with the low-k dielectric layer 165, helps reduce parasitic capacitance. At this point in the fabrication process, the semiconductor device 100, which may be located on a semiconductor wafer, is located in a deposition chamber 210, which may be one of a number of chambers within a cluster deposition tool, schematically represented by the dashed line. While in the deposition chamber 210, conventional processes and materials may be used to form the SiCN layer 180. For example, a carbon-containing gas, such as trimethylsilane may be used to form the SiCN layer 180.

Figure 2B:
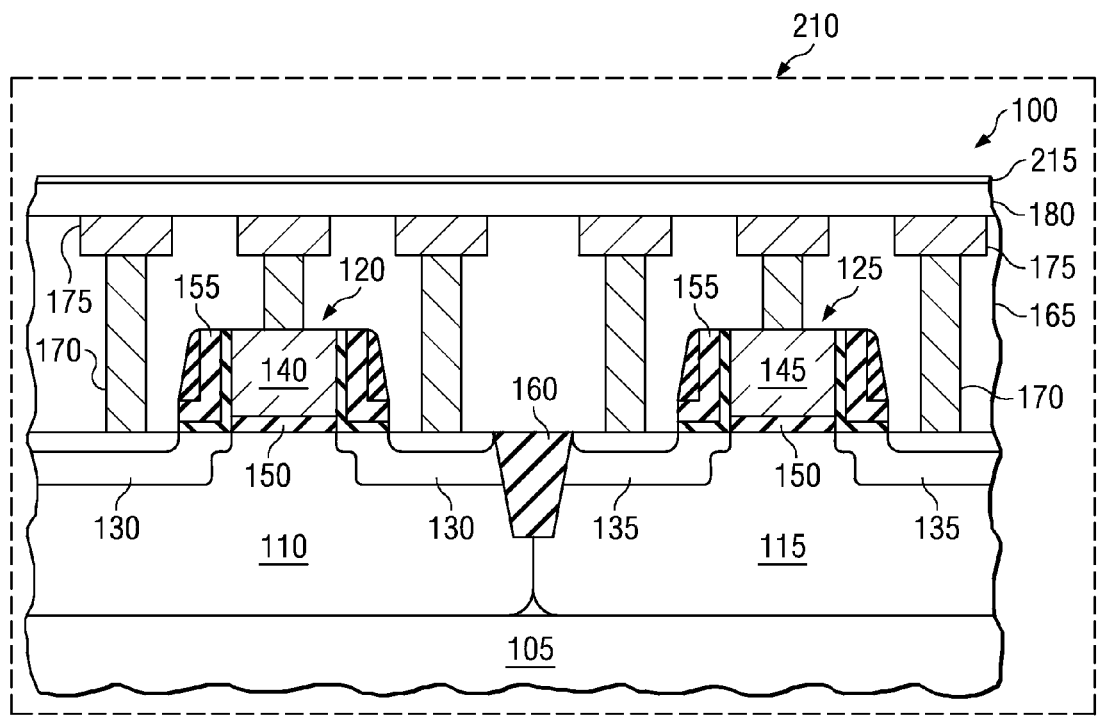

FIG. 2B illustrates the device 100 of FIG. 2A after the deposition of an adhesion layer 215. The adhesion layer 215 adheres well to the SiCN layer 180 and adheres well to an overlying dielectric layer. Though the material used to form the adhesion layer 215 may vary, in some embodiments, the adhesion layer 215 will have a dielectric constant that is higher than the dielectric constant of the SiCN layer 180. Such embodiments are counter-intuitive to semiconductor industry trends. As mentioned above, the industry is seeking to avoid the use of such higher-k materials to reduce parasitic capacitance. An example of this embodiment is one where the adhesion layer 215 comprises silicon nitride (SiN). As used herein SiN includes those instances where the adhesion layer is SiN, silicon-oxy-nitride ($SiO_xN_y$), or combinations thereof. In those embodiments where these types of materials are used, it is beneficial to keep the thickness of the adhesion layer 215 to a minimum such that parasitic capacitance remains low. For example in one embodiment, the adhesion layer 215 may have a thickness less than about 5 nm or less. Under conventional processes, these thickness regimes are difficult to achieve because conventional deposition tools used to deposit SiN are typically engineered to deposit SiN at high rates (e.g., about 100 nm/min), thereby making thin films very difficult to achieve.

In the embodiment where the adhesion layer 215 comprises SiN, it may be formed by discontinuing the flow of the carbon-containing gas used to form the SiCN layer 180 and flowing the silane and nitrogen into the chamber in which the SiCN layer 180 was formed. In one aspect of this embodiment, the SiN layer may be formed by flowing silane at a rate ranging from about 100 sccm to about 500 sccm, flowing nitrogen at a rate ranging from about 5000 sccm to about 20000 sccm in plasma conditions, and wherein the deposition occurs for a period ranging from about 0.5 seconds to about 1.5 seconds. In another aspect of this embodiment flowing nitrogen may include flowing ammonia at a rate that ranges from about 2000 sccm to about 7000 sccm.

In yet another aspect of this embodiment, the SiN layer may be formed by flowing silane at about 210 sccm and flowing nitrogen at about 9000 sccm in plasma conditions. A pressure within the deposition chamber is maintained at about 4 Torr and at a high frequency power of about 510 watts. The deposition is conducted for a period of about 1.1 seconds.

In another aspect, forming the SiN layer includes flowing silane at about 210 sccm, flowing nitrogen at about 9000 sccm and flowing ammonia at about 75 sccm in plasma conditions. A pressure within the deposition chamber is maintained at about 4 Torr and at a high frequency power of about 410 watts. The deposition is conducted for a period of about 0.4 seconds.

These various embodiments provide good deposition control such that a thin SiN layer can be achieved. As a result, the bulk dielectric constant of the SiCN layer 180 is kept substantially the same, thereby keeping parasitic capacitance low while achieving good layer adhesion. Moreover, it is believed that this improved deposition control allows for better film uniformity.

Figure 2C:
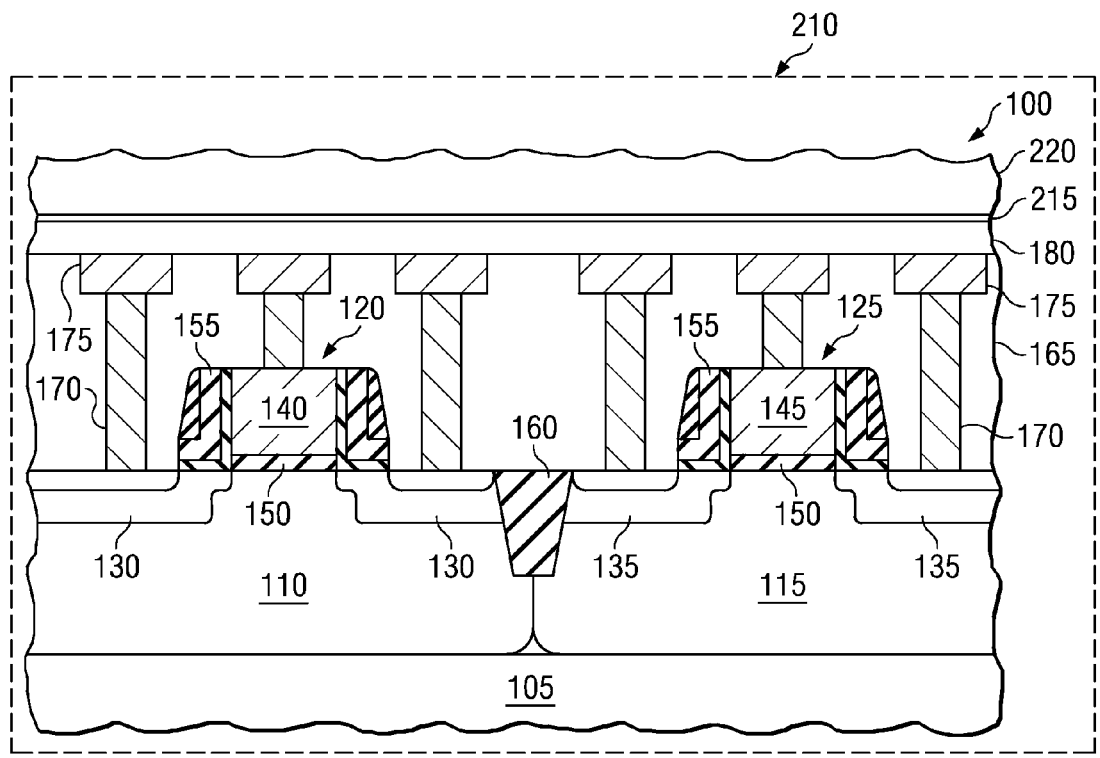

In FIG. 2C, following the formation of the adhesion layer 215, another interlevel dielectric layer 220, may be deposited on the adhesion layer 215. Another level of interconnects (not shown) may be formed in the interlevel dielectric layer 220, similar to those formed in dielectric layer 165. The same conventional processes and materials used to form dielectric layer 165 may be used to form dielectric layer 220.

Figure 2D:
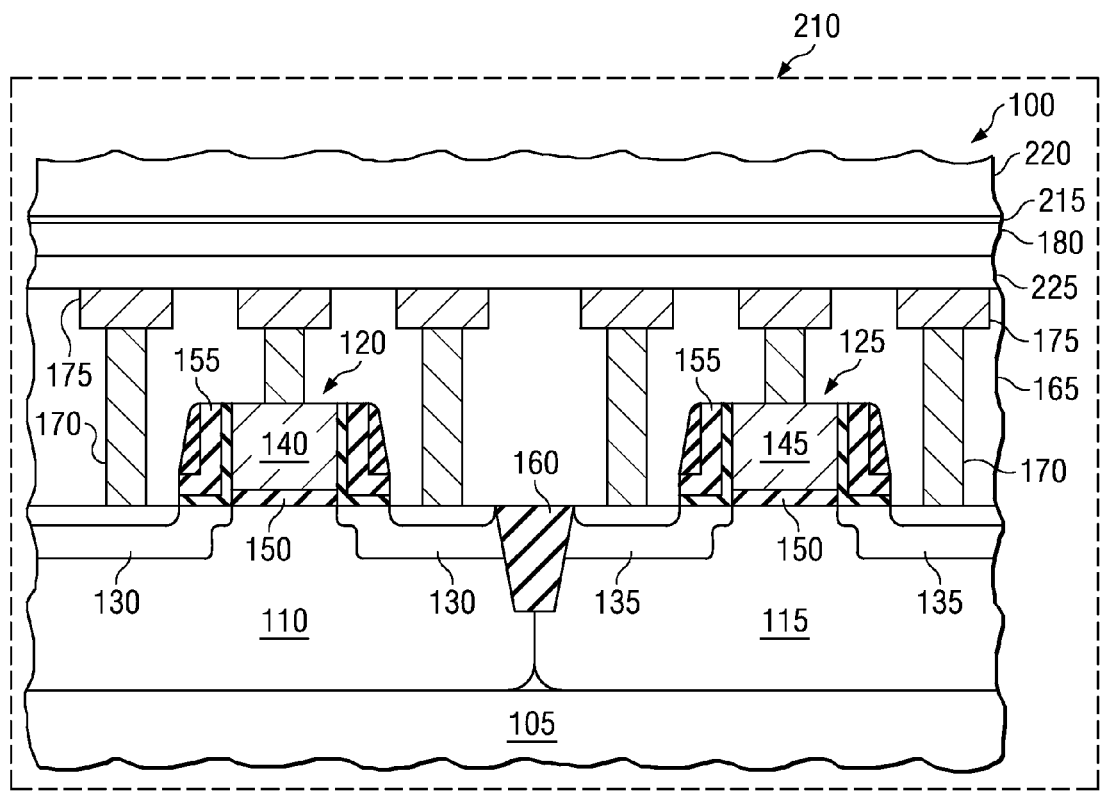

FIG. 2D illustrates another embodiment. This embodiment includes a layer 225 that is located between dielectric layer 165 and the SiCN layer 180. Layer 225 may be deposited over the dielectric layer 165 prior to the formation of the SiCN layer 180. Layer 225 may be comprised of the same type of material used to form adhesion layer 215. For example, in one embodiment, layer 225 may be comprised of SiN. Moreover, conventional deposition processes may be used to form layer 225. Thus, layer 225 may be formed in a conventional SiN deposition chamber, and as such, may have a thickness similar to the thickness of the SiCN layer 180. After formation of the SiCN layer 180, the adhesion layer 215 may be formed as described above.

Figure 3A:
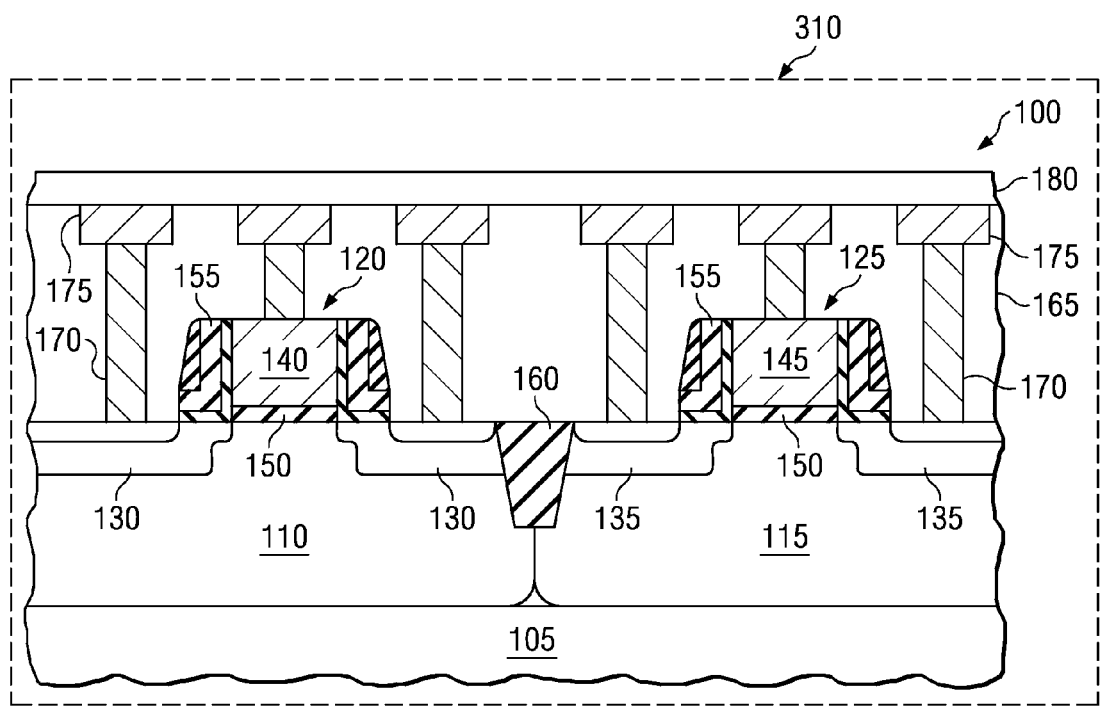
FIGS. 3A-3B illustrate another embodiment of a method that can used to fabricate the device of FIG. 1.
Figure 3B:
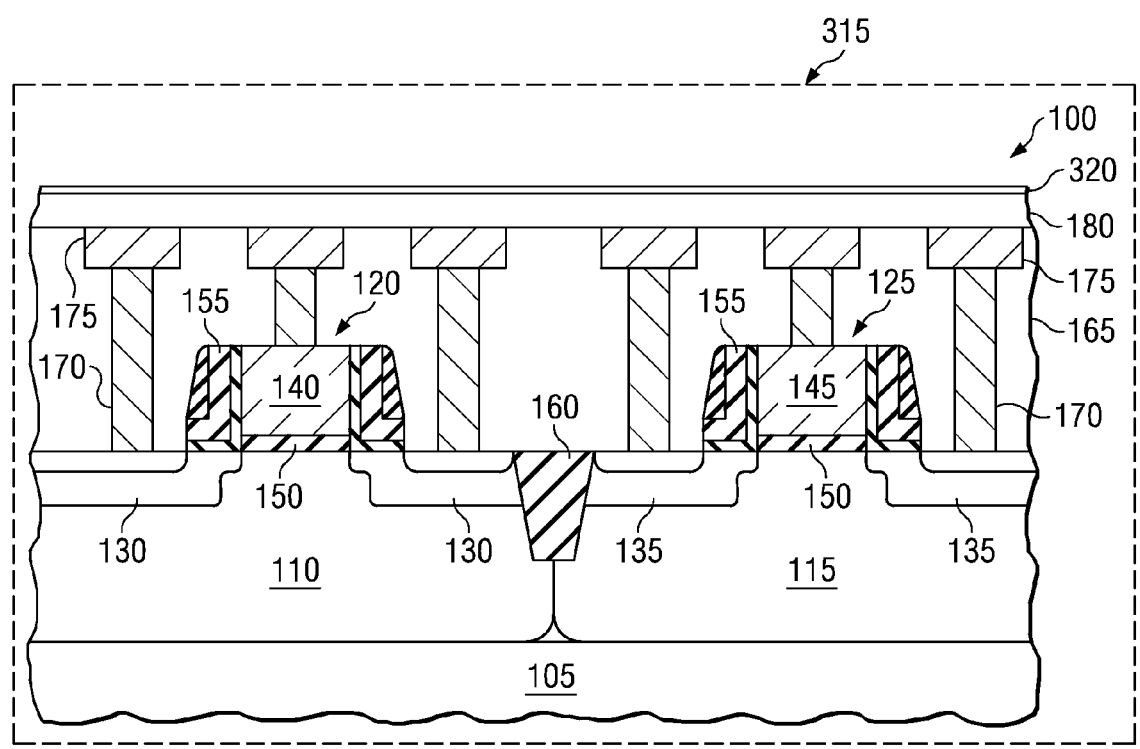

FIG. 3A illustrates another embodiment. In this embodiment, the semiconductor device 100 is shown at the point where it is located in a deposition chamber 310 that is used to form the SiCN layer 180. The processes discussed above for other embodiments may also be employed here to form the SiCN layer 180. After the formation of the SiCN layer 180, the semiconductor device 100 is transferred to another deposition furnace 315, as shown in FIG. 3B, which in one embodiment may be a deposition chamber in which an additional interlevel dielectric may be deposited. Adhesion layer 320 is then formed in situ using an oxygen plasma in the deposition chamber 315 to convert a portion of the SiCN layer to SiN. As mentioned above, certain embodiments include instances wherein the adhesion layer may comprise SiN, silicon oxynitride, or combinations thereof. Helium and/or hydrogen may also be used in forming the plasma. In those embodiments where helium is flowed with the oxygen, using the oxygen plasma includes flowing oxygen at a rate ranging from about 1000 sccm to about 6000 sccm and helium at a rate ranging from about 1000 sccm to about 6000 sccm and at a high frequency power ranging from about 100 watts to about 500 watts for a period ranging from about 5 seconds to about 40 seconds. The oxygen plasma converts a portion of the SiCN layer 180 and forms the adhesion layer 320 in situ. The helium aids in the removal of contaminants that might have formed on the surface of the SiCN layer 180 during transfer to the deposition chamber 315. As with previous embodiments, these embodiments provide for very good thickness control, thereby allowing manufacturers to achieve a relatively thin SiN layer.

Following the formation of the adhesion layer 320, conventional processes may then be used to form another dielectric layer over the adhesion layer 320 and interconnects as discussed above regarding other embodiments. The use of adhesion layer 320 provides better adhesion between the SiCN layer 180 and the overlying interlevel dielectric layer, thereby reducing blistering and improving yield. Other aspects of these embodiments include those instances where a SiN layer is located between the SiCN layer 180 and the underlying dielectric layer 165.

Figure 4:
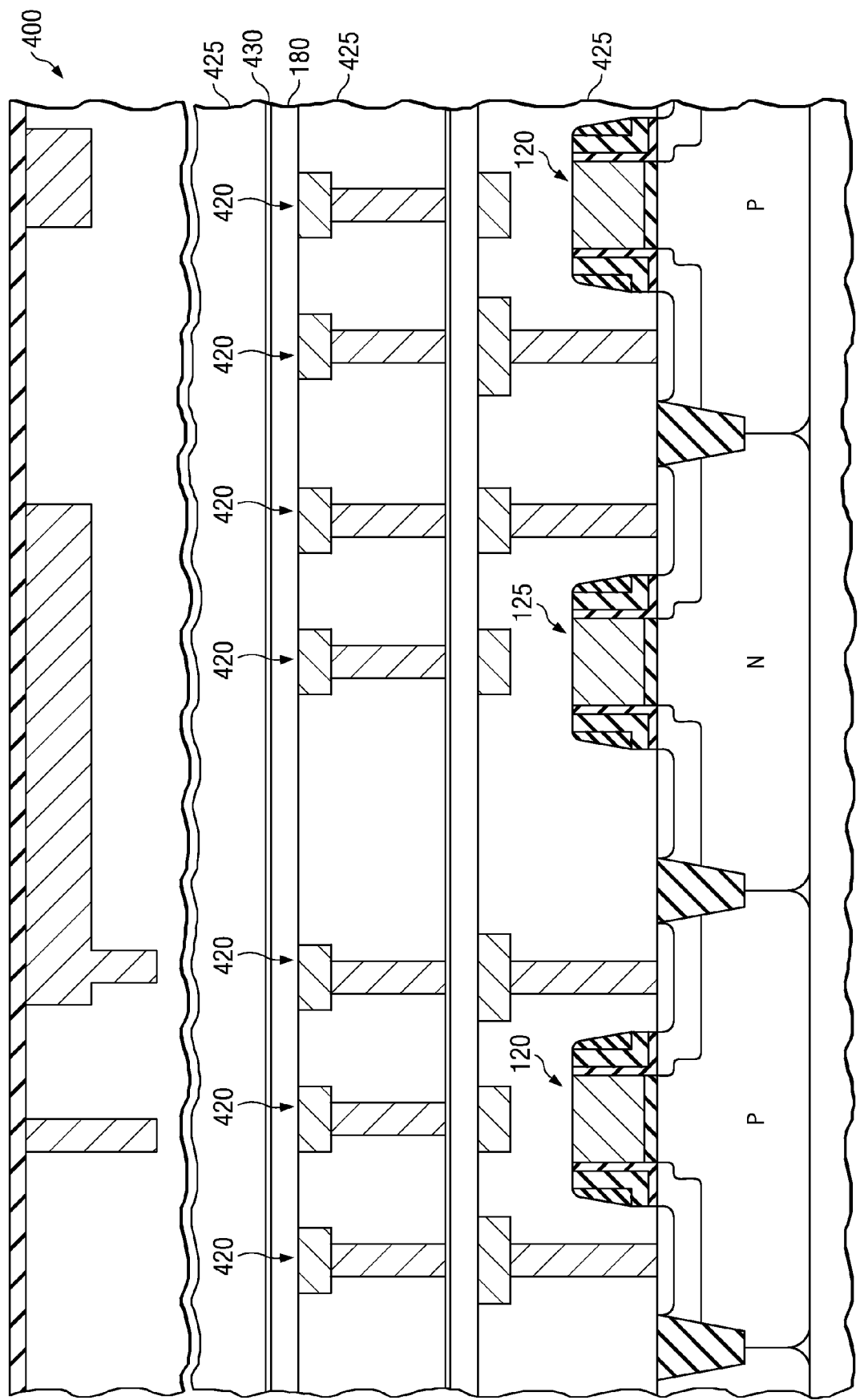
FIG. 4 illustrates an integrated circuit (IC) incorporating the semiconductor device of FIG. 1.

FIG. 4 illustrates an integrated circuit 400 into which the semiconductor device 100 of FIG. 1 may be incorporated. The IC 400, includes the transistors 120, 125, the interconnects 420, which can include both metal runners or lines and vias, located on or within one or more interlevel dielectric layers 425 that interconnect the transistors 120, 125. Conventional processes may be used to construct these components. The IC 400 also includes the SiCN layer 180 and adhesion layer 430 of the various embodiments as described above.

Those skilled in the art to which the disclosure relates will appreciate that other and further additions, deletions, substitutions, and modifications may be made to the described example embodiments, without departing from the disclosure.

What is claimed is:

1. A method of manufacturing a semiconductor device, comprising:
   forming transistors on a semiconductor substrate;
   forming a first interlevel dielectric layer over the transistors;
   forming metal interconnects within the first interlevel dielectric layer;
   using a carbon-containing gas to form a silicon carbon nitride layer over the metal interconnects and the first interlevel dielectric layer within a deposition chamber;
   forming, in situ, a silicon nitride layer on the silicon carbon nitride layer, within the deposition chamber, by discontinuing a flow of the carbon-containing gas and flowing silane and nitrogen; and
   forming a second interlevel dielectric layer over the SiN layer in a dielectric deposition chamber.

2. The method of claim 1, wherein forming the silicon nitride layer includes flowing silane at a rate ranging from about 100 sccm to about 500 sccm and flowing nitrogen at a rate ranging from about 5000 sccm to about 20000 sccm in plasma conditions, for a deposition period ranging from about 0.5 seconds to about 1.5 seconds.

3. The method of claim 2, wherein forming the silicon nitride layer includes flowing silane at about 210 sccm and flowing nitrogen at about 9000 sccm in plasma conditions, maintaining a pressure within the deposition chamber at about 4 Torr, and using a high frequency power of about 510 watts, for a deposition period of about 1.1 seconds.

4. The method of claim 1, wherein forming the SiN layer includes flowing silane at about 210 sccm, flowing nitrogen at about 9000 sccm and flowing ammonia at about 75 sccm in plasma conditions; maintaining a pressure within the deposition chamber at about 4 Torr; and using a high frequency power of about 410 watts; for a deposition period of about 0.4 seconds.

5. The method of claim 1, wherein flowing nitrogen includes flowing ammonia at a rate that ranges from about 3 sccm to about 12 sccm.

6. The method of claim 1, wherein forming the SiN layer includes forming the SiN layer to a thickness less than about 5 nm.

7. The method of claim 1, wherein the method further includes forming another silicon nitride layer on the metal interconnects and the first interlevel dielectric layer prior to forming the SiCN layer.

8. A method for manufacturing a semiconductor device, comprising:
   forming transistors on a semiconductor substrate;
   forming a first interlevel dielectric layer over the transistors;
   forming metal interconnects within the first interlevel dielectric layer;
   using a carbon-containing gas to form a silicon carbon nitride layer over the metal interconnects and the first interlevel dielectric layer within a deposition chamber of a deposition tool;
   forming, in situ, an adhesion layer on the silicon carbon nitride layer, within the deposition tool, by discontinuing a flow of the carbon-containing gas within the deposition chamber; and
   forming a second interlevel dielectric layer over the adhesion layer.

9. The method of claim 8, wherein forming the adhesion layer includes forming a silicon nitride layer.

10. The method of claim 9, wherein forming the SiN layer includes flowing silane at a rate ranging from about 100 sccm to about 500 sccm and flowing nitrogen at a rate ranging from about 5000 sccm to about 20000 sccm in plasma conditions, for a deposition period ranging from about 0.5 seconds to about 1.5 seconds.

11. The method of claim 8, wherein forming the adhesion layer includes forming the adhesion layer to less than about 5 nm.

12. The method of claim 8, wherein the adhesion layer is a first adhesion layer and the method further includes forming a second adhesion layer on the metal interconnects and the first interlevel dielectric layer prior to forming the silicon carbon nitride layer.

13. The method of claim 8, further including transferring the semiconductor device to a dielectric deposition chamber prior to forming the second interlevel dielectric layer and forming the adhesion layer in situ includes using an oxygen plasma in the dielectric deposition chamber to convert a portion of the silicon carbon nitride layer to silicon nitride.

14. The method of claim 13, wherein using the oxygen plasma includes flowing oxygen at a rate ranging from about 1000 sccm to about 6000 sccm and helium at a rate ranging from about 1000 sccm to about 6000 sccm and at a high frequency power ranging from about 100 watts to about 500 watts for a period ranging from about 5 seconds to about 40 seconds.

15. A method for manufacturing a semiconductor device, comprising:
    forming transistors on a semiconductor substrate;
    forming a first interlevel dielectric layer over the transistors;
    forming metal interconnects within the first interlevel dielectric layer;
    forming a silicon carbon nitride layer over the metal interconnects and the first interlevel dielectric layer within a deposition chamber;
    placing the semiconductor device in a dielectric deposition chamber subsequent to forming the silicon carbon nitride layer;
    forming a silicon nitride layer on the silicon carbon nitride layer within the dielectric deposition chamber using an oxygen plasma to convert a portion of the silicon carbon nitride layer tosilicon nitride; and
    forming a second interlevel dielectric layer over the silicon nitride layer in the dielectric deposition chamber.

16. The method of claim 15, wherein using the oxygen plasma includes flowing oxygen at a rate ranging from about 1000 sccm to about 6000 sccm and helium at a rate ranging from about 1000 sccm to about 6000 sccm and at a high frequency power ranging from about 100 watts to about 500 watts for a period ranging from about 5 seconds to about 40 seconds.

17. The method of claim 16, wherein using the oxygen plasma includes flowing oxygen at a rate of about 3000 sccm and at a high frequency power of about 210 watts for a period of about 10 seconds.

18. The method of claim 17, further including flowing helium at a rate of about 3000 sccm in the dielectric deposition chamber.

19. A method of manufacturing a semiconductor device, comprising:
    forming a first interlevel dielectric layer over transistors on a substrate;
    forming first interconnects within the first interlevel dielectric layer;
    forming a first silicon nitride layer over the first interlevel dielectric layer;
    forming a silicon carbon nitride layer over the first silicon nitride layer, the silicon carbon nitride layer having a low-k dielectric constant;
    forming a second silicon nitride layer over the silicon carbon nitride layer;
    forming a second interlevel dielectric layer over the second silicon nitride layer, the second interlevel dielectric layer having a low-k dielectric constant; and
    forming second interconnects within the second interlevel dielectric layer;
    wherein the second silicon nitride layer is formed as an adhesion layer in situ in a same chamber as used for forming the silicon carbon nitride layer or for forming the second interlevel dielectric layer; and the second silicon nitride layer is sufficiently thin so that a bulk dielectric constant of the silicon carbon nitride layer and the second silicon nitride layer is substantially the same as the dielectric constant of the silicon carbon nitride layer.

20. The method of claim 19, wherein the second silicon nitride layer is formed in situ in the same chamber as used for forming the silicon carbon nitride layer; the silicon carbon nitride layer is formed by flowing a carbon-containing gas within the chamber; and the second silicon nitride layer is formed by discontinuing the flow of carbon-containing gas and flowing silane and nitrogen into the chamber.

21. The method of claim 20, wherein the silane is flowed at a rate of about 100 sccm to 500 sccm; the nitrogen is flowed at a rate of about 5000 sccm to 20000 sccm; and silicon nitride deposition occurs for about 0.5 to 1.5 seconds.

22. The method of claim 20, wherein the silane is flowed at a rate of about 100 sccm to 500 sccm; ammonia is flowed at a rate of about 2000 sccm to 7000 sccm; and the silieon nitride deposition occurs for about 0.4 to 1.5 seconds.

23. The method of claim 19, wherein the second silieon nitride layer is formed in situ in the same ehamber as used for forming the second interlevel dielectric layer; and the silicon nitride layer is formed using an oxygen plasma to convert a portion of the silicon carbon nitride layer to silicon nitride.

24. The method of claim 23, wherein the second silicon nitride layer is formed by flowing oxygen at a rate of 1000 sccm to 6000 sccm and helium at a rate of 1000 sccm to 6000 sccm, at a high frequency power of 100 watts to 500 watts, for about 5 to 40 seconds.

25. The method of claim 19, wherein the second silicon nitride layer has a thickness of about 5 nm or less.

* * * * *